(12) United States Patent
Hatano et al.

(10) Patent No.: US 11,095,130 B2
(45) Date of Patent: *Aug. 17, 2021

(54) POWER STORAGE APPARATUS FOR ESTIMATING AN OPEN-CIRCUIT VOLTAGE

(71) Applicant: KABUSHIKI KAISHA TOYOTA JIDOSHOKKI, Aichi (JP)

(72) Inventors: Junichi Hatano, Kariya (JP); Toshio Otagiri, Kariya (JP); Hiroto Sato, Kariya (JP); Shinichi Aizawa, Kariya (JP); Ryusuke Hase, Kariya (JP); Kenji Nishigaki, Kariya (JP)

(73) Assignee: KABUSHIKI KAISHA TOYOTA JIDOSHOKKI, Aichi (JP)

( * ) Notice: Subject to any disclaimer, the term of this patent is extended or adjusted under 35 U.S.C. 154(b) by 283 days.

This patent is subject to a terminal disclaimer.

(21) Appl. No.: 16/336,177

(22) PCT Filed: Sep. 8, 2017

(86) PCT No.: PCT/JP2017/032400
§ 371 (c)(1),
(2) Date: Mar. 25, 2019

(87) PCT Pub. No.: WO2018/066298
PCT Pub. Date: Apr. 12, 2018

(65) Prior Publication Data
US 2019/0229539 A1     Jul. 25, 2019

(30) Foreign Application Priority Data

Oct. 6, 2016    (JP) ............................. JP2016-197814
Dec. 28, 2016    (JP) ............................. JP2016-254693

(51) Int. Cl.
*H02J 7/00*      (2006.01)
*G01R 31/367*      (2019.01)
(Continued)

(52) U.S. Cl.
CPC ............ *H02J 7/0021* (2013.01); *G01R 31/36* (2013.01); *G01R 31/367* (2019.01); *H01M 10/46* (2013.01); *H01M 10/48* (2013.01); *H02J 7/00* (2013.01)

(58) Field of Classification Search
CPC ..................................................... H02J 7/0021
(Continued)

(56) References Cited

U.S. PATENT DOCUMENTS 6,850,038 B2    2/2005   Arai et al.
7,570,021 B2 *   8/2009   Togashi ................ B60W 20/13
                                                                      320/130
(Continued)

FOREIGN PATENT DOCUMENTS

JP    2004-085574     3/2004
JP    2016-109466     6/2016
(Continued)

OTHER PUBLICATIONS

Official Communication issued in International Bureau of WIPO Patent Application No. PCT/JP2017/032400, dated Nov. 28, 2017.
(Continued)

*Primary Examiner* — Yalkew Fantu
(74) *Attorney, Agent, or Firm* — Greenblum & Bernstein, P.L.C.

(57) ABSTRACT

Provided is a power storage apparatus including a battery and a control circuit that controls charging and discharging of the battery, wherein during a polarization elimination time period, the control circuit obtains, as an amount of change, a difference between a first voltage of the battery measured at a first time and a second voltage of the battery measured at a second time following the first time, multiplies the amount of change by an estimation coefficient that depends on the first voltage, the second voltage, a temperature of the
(Continued)

battery, a temperature of a space around the battery, or a degree of deterioration of the battery, and sums the value obtained so as to estimate an open-circuit voltage to be provided after elimination of the polarization of the battery.

13 Claims, 7 Drawing Sheets

(51) Int. Cl.
  *H01M 10/48* (2006.01)
  *H01M 10/46* (2006.01)
  *G01R 31/36* (2020.01)

(58) Field of Classification Search
  USPC .......................................................... 320/134
  See application file for complete search history.

(56) References Cited

U.S. PATENT DOCUMENTS

| | | | | |
|---|---|---|---|---|
| 10,436,850 | B2* | 10/2019 | Hatano | G01R 31/3842 |
| 2014/0111163 | A1* | 4/2014 | Yamauchi | H02J 7/0068 |
| | | | | 320/134 |
| 2014/0139189 | A1* | 5/2014 | Izumi | G01R 31/3842 |
| | | | | 320/134 |
| 2014/0225621 | A1 | 8/2014 | Kimura et al. | |
| 2015/0134283 | A1 | 5/2015 | Ogura | |

FOREIGN PATENT DOCUMENTS

| | | | |
|---|---|---|---|
| JP | 2016-139525 | | 8/2016 |
| JP | 2016139525 | * | 8/2016 |
| WO | 2013/054414 | | 4/2013 |
| WO | 2013/171786 | | 11/2013 |

OTHER PUBLICATIONS

Official Communication issued in International Bureau of WIPO Patent Application No. PCT/JP2017/032400, dated Nov. 28, 2017, along with an English translation thereof.

* cited by examiner

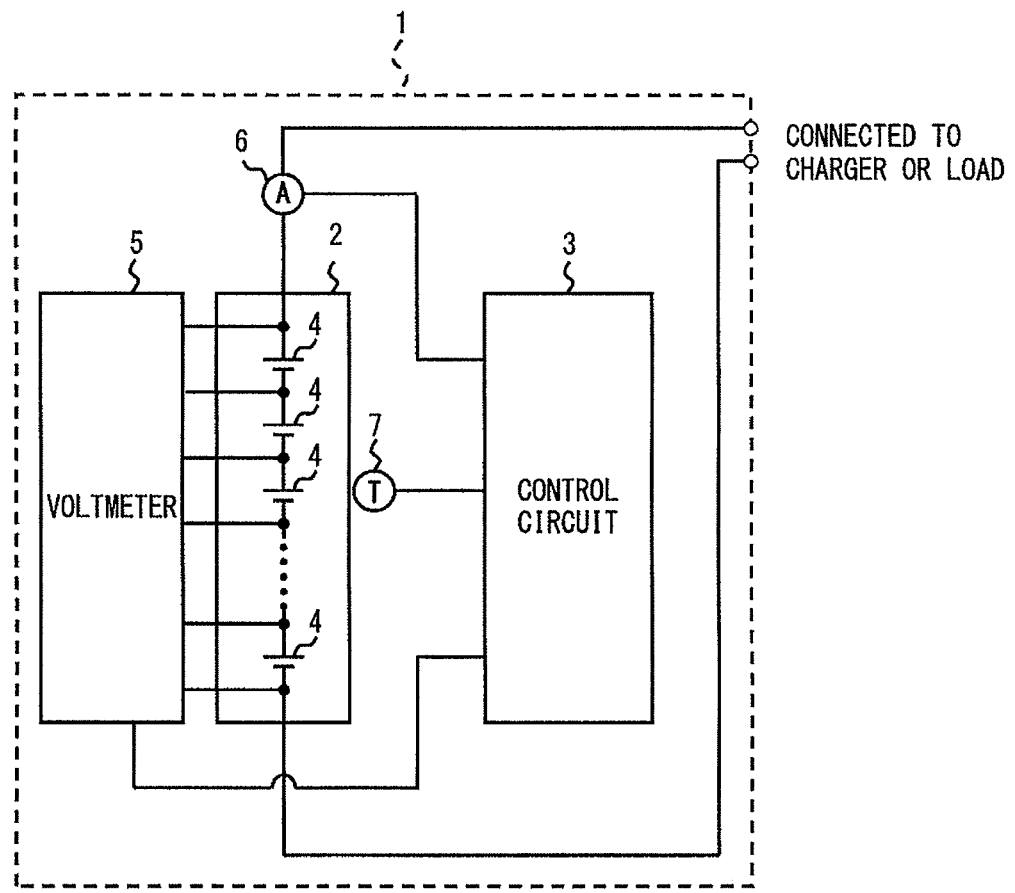
F I G. 1

(A)

(B)

POWER STORAGE APPARATUS FOR ESTIMATING AN OPEN-CIRCUIT VOLTAGE

TECHNICAL FIELD

The present invention relates to a power storage apparatus that estimates an open-circuit voltage.

BACKGROUND ART

As a method of estimating, during a polarization elimination time period extending from a battery charging or discharging end time to a polarization-eliminated time at which polarization of the battery can be judged to be eliminated, an open-circuit voltage (OCV) and state of charge (SOC) to be provided after elimination of polarization, a method is known wherein the difference between a voltage V1 measured at a time t1 set within the polarization elimination time period and a voltage V2 measured at a time t2 following time t1 is obtained as an amount of change, an open-circuit voltage to be provided after the elimination of polarization is estimated using the amount of change, and a state of charge to be provided after the elimination of polarization is estimated using the estimated open-circuit voltage.

Related techniques include the technique described in patent literature 1.

CITATION LIST

Patent Literature

Patent literature 1: Japanese Laid-open Patent Publication No. 2016-139525

SUMMARY OF INVENTION

Technical Problem

However, when an open-circuit voltage at a battery charging or discharging end time is equal to or lower than a predetermined voltage, a polarization elimination time period becomes longer than a polarization elimination time period that would be provided when the open-circuit voltage at the battery charging or discharging end time is higher than the predetermined voltage. Accordingly, a polarization elimination time period is extended when an open-circuit voltage at a battery charging or discharging end time is equal to or lower than a predetermined voltage, and hence a temporal variation in the open-circuit voltage during the polarization elimination time period will be less significant than a temporal variation in the open-circuit voltage that would be seen when the open-circuit voltage at the battery charging or discharging end time is higher than the predetermined voltage. Thus, the amount of change made when an open-circuit voltage at a battery charging or discharging end time will be equal to or lower than a predetermined voltage is smaller than an amount of change that would be made when the open-circuit voltage at the battery charging or discharging end time is higher than the predetermined voltage.

Accordingly, due to the difference in amount of change, without using different methods for estimation of an open-circuit voltage to be provided after elimination of polarization for a situation in which an open-circuit voltage at a battery charging or discharging end time is equal to or lower than a predetermined voltage and for a situation in which the open-circuit voltage at the battery charging or discharging end time is higher than the predetermined voltage, the accuracy in estimation of the open-circuit voltage would be decreased, thereby leading to a large difference between an open-circuit voltage to be provided after elimination of polarization that is to be estimated and an actual open-circuit voltage. In addition, using an open-circuit voltage estimated with reduced accuracy decreases the accuracy in estimation of a state of charge.

Moreover, a change in the temperature of a battery body or in the temperature of a space around the battery or a change in the degree of deterioration of the battery makes a change in a polarization elimination time period and thus decreases the accuracy in estimation of an open-circuit voltage.

An object in accordance with an aspect of the present invention is to provide a power storage apparatus that increases the accuracy in estimation of an open-circuit voltage to be provided after elimination of polarization.

Means for Solving the Problem

A power storage apparatus in accordance with one mode of the invention includes a battery and a control circuit that controls the charging and discharging of the battery.

During a polarization elimination time period extending from a battery charging or discharging end time to a polarization-eliminated time at which polarization of a battery can be judged to have been eliminated, the control circuit obtains, as an amount of change, the difference between a first voltage of the battery measured at a first time and a second voltage of the battery measured at a second time following the first time, multiplies the amount of change by an estimation coefficient that depends on the first voltage, the second voltage, the temperature of a battery body, the temperature of a space around the battery, or the degree of deterioration of the battery, and sums the value obtained in the multiplication and the first or second voltage so as to estimate an open-circuit voltage to be provided after elimination of the polarization of the battery.

A power storage apparatus in accordance with another mode of the invention includes a battery and a control circuit that controls the charging and discharging of the battery.

During a polarization elimination time period extending from a battery charging or discharging end time to a polarization-eliminated time at which polarization of a battery can be judged to have been eliminated, the control circuit obtains, as an amount of change, the difference between a first voltage of the battery measured at a first time and a second voltage of the battery measured at a second time following the first time, multiplies the amount of change by an estimation coefficient that depends on a first state of charge corresponding to the first voltage or a second state of charge corresponding to the second voltage, and sums the value obtained in the multiplication and the first or second voltage so as to estimate an open-circuit voltage to be provided after elimination of the polarization of the battery.

Advantageous Effects of Invention

The accuracy in estimation of an open-circuit voltage to be provided after polarization is eliminated can be increased.

BRIEF DESCRIPTION OF DRAWINGS

FIG. 1 illustrates an implementation of a power storage apparatus;

DESCRIPTION OF EMBODIMENTS

Figure 2:
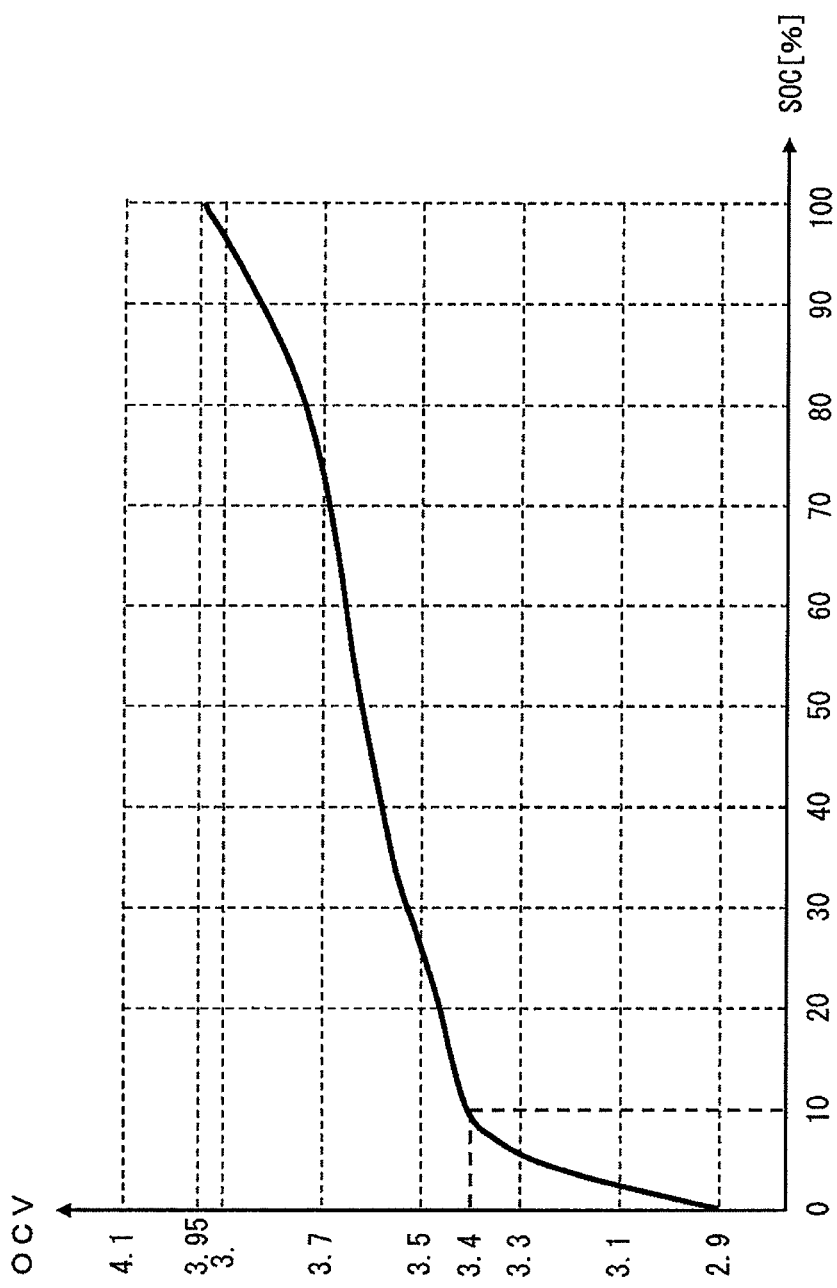
FIG. 2 illustrates an implementation of OCV-SOC characteristics.

The following describes embodiments in detail on the basis of the drawings.

FIG. 1 illustrates an implementation of a power storage apparatus 1. The power storage apparatus 1 depicted in FIG. 1 is, for example, a battery pack and can possibly be installed in a vehicle. In this example, the power storage apparatus 1 includes an assembled battery 2 provided with one or more batteries 4, a control circuit 3 that controls the power storage apparatus 1, a voltmeter 5 that measures the voltage of the battery 4, an ammeter 6 that measures a current flowing through the assembled battery 2, and a thermometer 7 that measures the temperature of the body of the battery 4 or the temperature of a space around the battery 4. The battery 4 of the assembled battery 2 is, for example, a rechargeable battery such as a nickel-hydrogen battery or a lithium-ion battery, or a power storage element. The assembled battery 2 may be connected to, and thus charged by, a charger. Alternatively, a load may be connected to the assembled battery 2, and power may be supplied from the assembled battery 2 to the load, i.e., the assembled battery 2 may be discharged.

The control circuit 3 controls the charging and discharging of the power storage apparatus 1 and the battery 4 and estimates an open-circuit voltage and a state of charge during a polarization elimination time period extending up to a polarization-eliminated time at which polarization after the end of the charging or discharging can be judged to have been eliminated. The control circuit 3 can be a circuit that uses, for example, a central processing unit (CPU), a multicore CPU, or a programmable device (e.g., field programmable gate array (FPGA), programmable logic device (PLD)). The control circuit 3 includes a storage part provided inside or outside thereof and reads and executes programs stored in the storage part for controlling components of the power storage apparatus 1. The control circuit 3 may be, for example, one or more electronic control units (ECUs) installed in a vehicle.

The following describes estimation of an open-circuit voltage during a polarization elimination time period.

(A) Estimation based on voltage

During a polarization elimination time period T1 extending from a charging or discharging end time t0 of the battery 4 to a polarization-eliminated time t3 at which polarization of the battery 4 can be judged to have been eliminated, the control circuit 3 obtains, as an amount of change, the difference between a voltage V1 (first voltage) of the battery 4 measured at time t1 (first time) and a voltage V2 (second voltage) of the battery 4 measured at a time t2 (second time) following time t1 (=V2−V1), and multiplies the amount of change by an estimation coefficient a that depends on voltage V1, voltage V2, the temperature of the body of the battery 4, the temperature of a space around the battery 4, or the degree of deterioration of the battery 4, and sums the value obtained in the multiplication and voltage V1 so as to estimate an open-circuit voltage OCV1 to be provided after elimination of the polarization of the battery 4. See formula 1.

$$OCV1 = V1 + (V2 - V1) \times a \quad \text{(Formula 1)}$$

The control circuit 3 may be configured to subtract, at polarization-eliminated time t3, voltage V1 from the open-circuit voltage OCV1 provided after elimination of polarization of the battery 4, divide the value obtained in the subtraction by the difference between voltages V2 and V1, and define the value obtained in the division as an estimation coefficient a to be used in a next estimation of an open-circuit voltage. See formula 2.

$$a = (OCV1 - V1)/(V2 - V1) \quad \text{(Formula 2)}$$

Alternatively, during polarization elimination time period T1, the control circuit 3 may obtain, as an amount of change, the difference between voltage V1 (first voltage) and voltage V2 (second voltage) (=V2−V1), multiplies the amount of change by an estimation coefficient a that depends on voltage V1, voltage V2, the temperature of the body of the battery 4, the temperature of a space around the battery 4, or the degree of deterioration of the battery 4, and sums the value obtained in the multiplication and voltage V2 so as to estimate an open-circuit voltage OCV1 to be provided after elimination of the polarization of the battery 4. See formula 1′.

$$OCV1 = V2 + (V2 - V1) \times a \quad \text{(Formula 1')}$$

The control circuit 3 may be configured to subtract, at polarization-eliminated time t3, voltage V2 from the open-circuit voltage OCV1 provided after elimination of polarization of the battery 4, divide the value obtained in the subtraction by the difference between voltages V2 and V1, and define the value obtained in the division as an estimation coefficient a to be used in a next estimation of an open-circuit voltage. See formula 2′.

$$a = (OCV1 - V2)/(V2 - V1) \quad \text{(Formula 2')}$$

The following describes the setting of an estimation coefficient in (A).

(A1) Voltage V1 or V2 having a lower value causes the control circuit 3 to set a higher value as estimation coefficient a. Voltage V1 or V2 having a higher value causes the control circuit 3 to set a lower value as estimation coefficient a.

This is because a polarization elimination time period provided when the open-circuit voltage at charging or discharging end time t0 is low is longer than a polarization elimination time period that would be provided when the open-circuit voltage at charging or discharging end time t0 is high. Accordingly, a polarization elimination time period is extended when an open-circuit voltage at charging or discharging end time t0 is low, and hence a temporal variation in the open-circuit voltage during the polarization elimination time period is less significant than the temporal variation in the open-circuit voltage that would be seen when the open-circuit voltage at charging or discharging end time t0 is high. Thus, the amount of change made when an open-circuit voltage at charging or discharging end time t0 is low is smaller than the amount of change that would be made when the open-circuit voltage at charging or discharging end time t0 is high. Hence, voltage V1 or V2 having a lower value causes a higher value to be set as estimation coefficient a, and voltage V1 or V2 having a higher value causes a lower value to be set as estimation coefficient a.

(A2) The amount of change having a lower value causes the control circuit 3 to set a higher value as estimation coefficient a. The amount of change having a higher value causes the control circuit 3 to set a lower value as estimation coefficient a.

This is because, as in the case of (A1), an amount of change provided when the open-circuit voltage at charging or discharging end time t0 is low is smaller than an amount of change that would be provided when the open-circuit voltage at charging or discharging end time t0 is high. Hence, the amount of change having a lower value causes a higher value to be set as estimation coefficient a, and the amount of change having a higher value causes a lower value to be set as estimation coefficient a.

(A3) The control circuit 3 sets a higher value as estimation coefficient a for an inclination having a higher value, wherein the inclination is calculated on the basis of the amount of change and a state-of-charge change amount that is the difference between a state of charge SOC1 corresponding to voltage V1 and a state of charge SOC2 corresponding to voltage V2 (=amount of change/state-of-charge change amount=(V2−V1)/(SOC2−SOC1)). The inclination having a lower value causes the control circuit 3 to set a lower value as estimation coefficient a.

This is because the inclination is large for a range in which the open-circuit voltage and the state of charge are low and is small for a range in which the open-circuit voltage and the state of charge are high. FIG. 2, which illustrates an implementation of OCV-SOC characteristics, indicates a relationship between open-circuit voltage OCV and a state of charge SOC that corresponds to open-circuit voltage OCV. As depicted in FIG. 2, for example, the inclination of an OCV-SOC characteristic curve is large for a range in which the open-circuit voltage and the state of charge are low (open-circuit voltage OCV is within a range from 2.9 [V] to 3.4 [V] and the state of charge is within a range from 0 [%] to 10 [%]) and is small for a range in which the open-circuit voltage and the state of charge are high (open-circuit voltage OCV is higher than 3.4 [V] and equal to or lower than 3.95 [V], and the state of charge is higher than 10 [%] and equal to or lower than 100 [%]). Accordingly, when the inclination is large, voltages V1 and V2 fall within a range with a low open-circuit voltage, and hence a larger inclination causes a higher value to be set as estimation coefficient a. By contrast, when the inclination is small, voltages V1 and V2 fall within a range with a high open-circuit voltage, and hence a smaller inclination causes a lower value to be set as estimation coefficient a. In this example, the inclination determined according to (V2−V1)/(SOC2−SOC1) is considered to be identical with the inclination of the OCV-SOC characteristic curve.

(A4) The control circuit 3 may set estimation coefficient a2 (first estimation coefficient) as the estimation coefficient when voltage V1 or V2 is equal to or less than voltage threshold Vth and set an estimation coefficient a1 (second estimation coefficient) lower than estimation coefficient a2 as the estimation coefficient when voltage V1 or V2 is greater than voltage threshold Vth.

Figure 3:
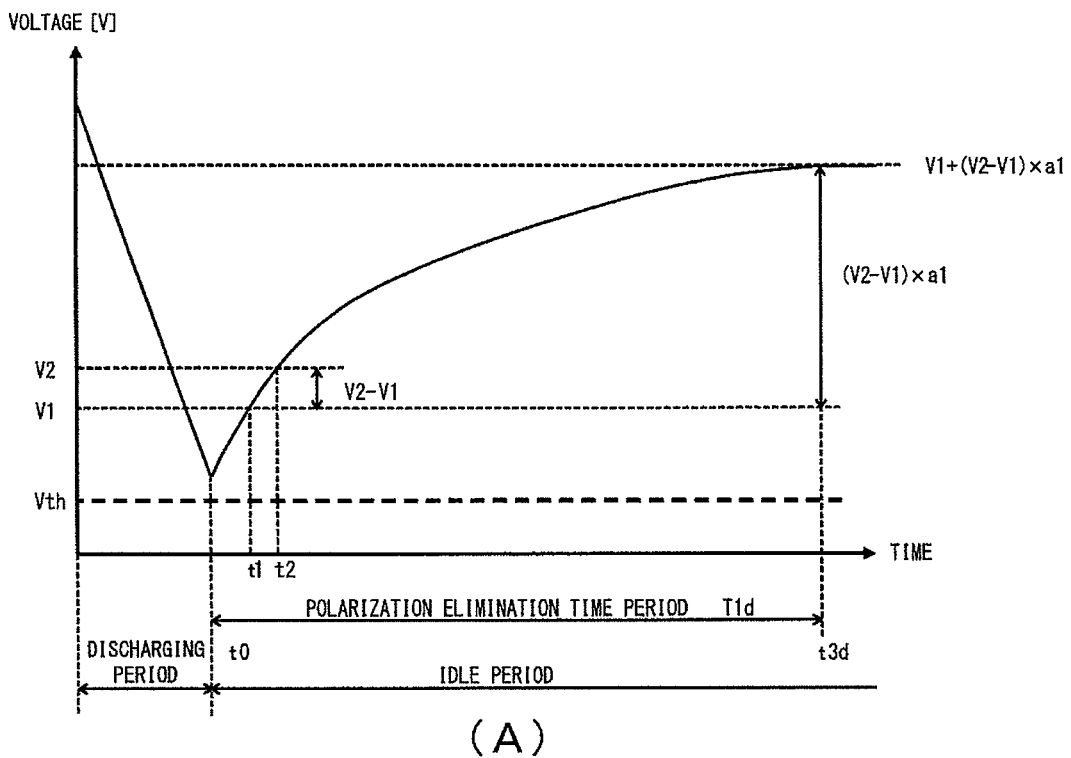
FIG. 3 illustrates implementations of temporal variations in a voltage during a discharging period and a polarization elimination time period after the end of discharging.
Figure 3:
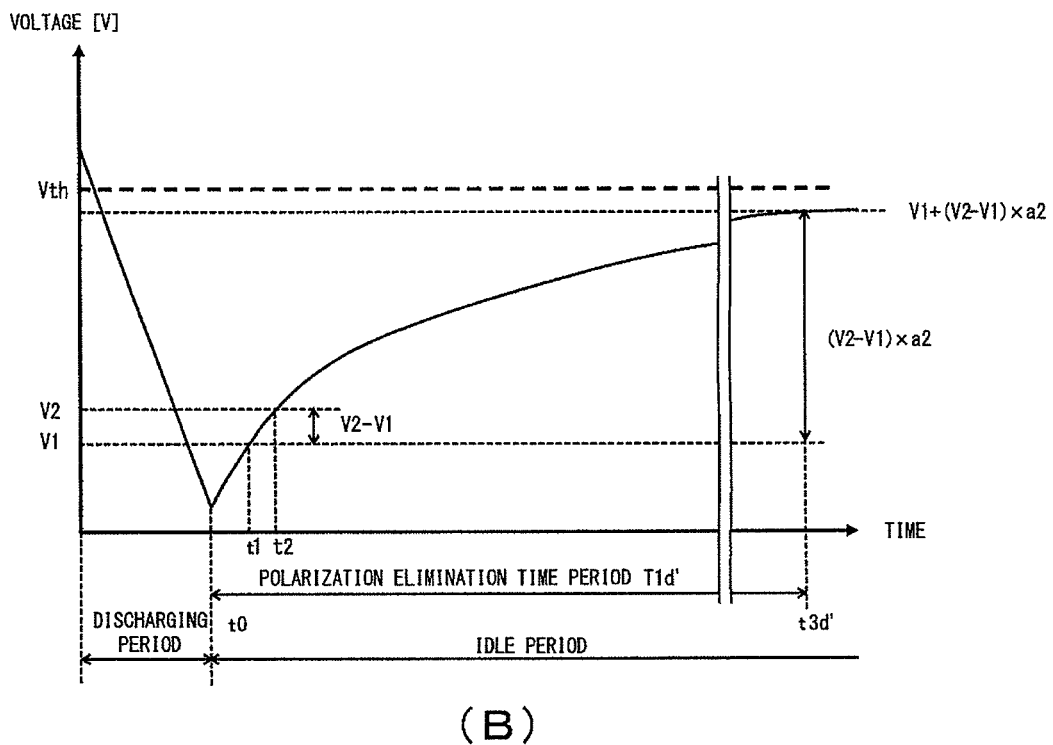

This is because, as in the case of (A1), in the case of discharging, a polarization elimination time period T1d' provided when the open-circuit voltage at discharging end time t0 is equal to or less than voltage threshold Vth (B in FIG. 3) is, as depicted in FIG. 3, longer than a polarization elimination time period T1d provided when the open-circuit voltage at discharging end time t0 is greater than voltage threshold Vth (A in FIG. 3). Accordingly, polarization elimination time period T1d' is longer than polarization elimination time period T1d when an open-circuit voltage at discharging end time t0 is equal to or lower than voltage threshold Vth, and hence a temporal variation in the open-circuit voltage during polarization elimination time period T1d' is less significant than the temporal variation in the open-circuit voltage that would be seen when the open-circuit voltage at discharging end time t0 is higher than voltage threshold Vth. Thus, the amount of change made when an open-circuit voltage at discharging end time t0 is equal to or lower than voltage threshold Vth is smaller than the amount of change that would be made when the open-circuit voltage at discharging end time t0 is greater than voltage threshold Vth. Accordingly, the estimation coefficient is set to estimation coefficient a2 when voltage V1 or V2 is equal to or less than voltage threshold Vth, and the estimation coefficient is set to estimation coefficient a1, which is lower than estimation coefficient a2, when voltage V1 or V2 is greater than voltage threshold Vth.

FIG. 3 illustrates implementations of temporal variations in a voltage during a discharging period and a polarization elimination time period after the end of discharging. A in FIG. 3 indicates a temporal variation in a voltage seen during a discharging period and a polarization elimination time period T1d after the end of discharging (time period extending from time t0 to time t3d) when the open-circuit voltage at discharging end time t0 is greater than voltage threshold Vth and voltages V1 and V2 are greater than voltage threshold Vth. For example, A indicates a temporal variation in a voltage seen during a discharging period and a polarization elimination time period after the end of discharging when voltages V1 and V2 are higher than 3.4 [V], i.e., the voltage threshold Vth depicted in FIG. 2 (3.4 [V]<V1, V2≤3.95 [V]). B in FIG. 3 indicates a temporal variation in a voltage seen during a discharging period and a polarization elimination time period T1d' after the end of discharging (time period extending from time t0 to time t3d') when the open-circuit voltage at discharging end time t0 is equal to or less than voltage threshold Vth and voltages V1 and V2 are equal to or less than voltage threshold Vth. For example, B indicates a temporal variation in a voltage seen during a discharging period and a polarization elimination time period after the end of discharging when voltages V1 and V2 are equal to or lower than 3.4 [V], i.e., the voltage threshold Vth depicted in FIG. 2 (2.9 [V]≤V1, V2≤3.4 [V]).

Figure 4:
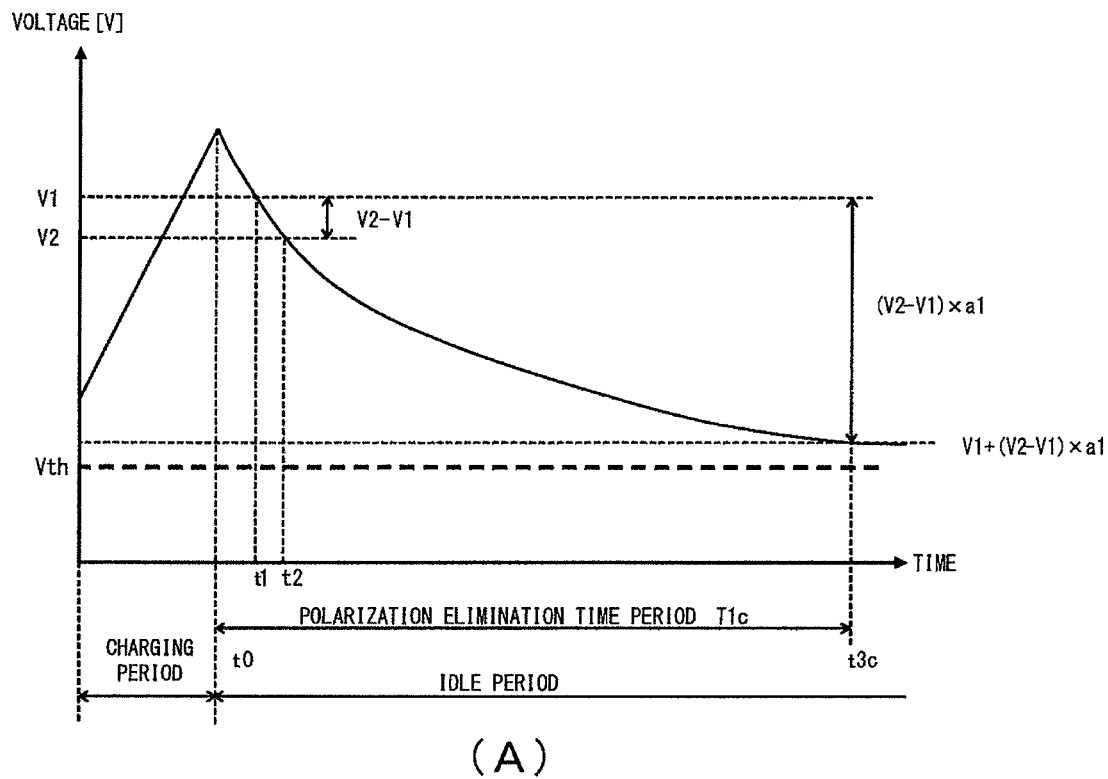
FIG. 4 illustrates implementations of temporal variations in a voltage during a charging period and a polarization elimination time period after the end of charging.
Figure 4:
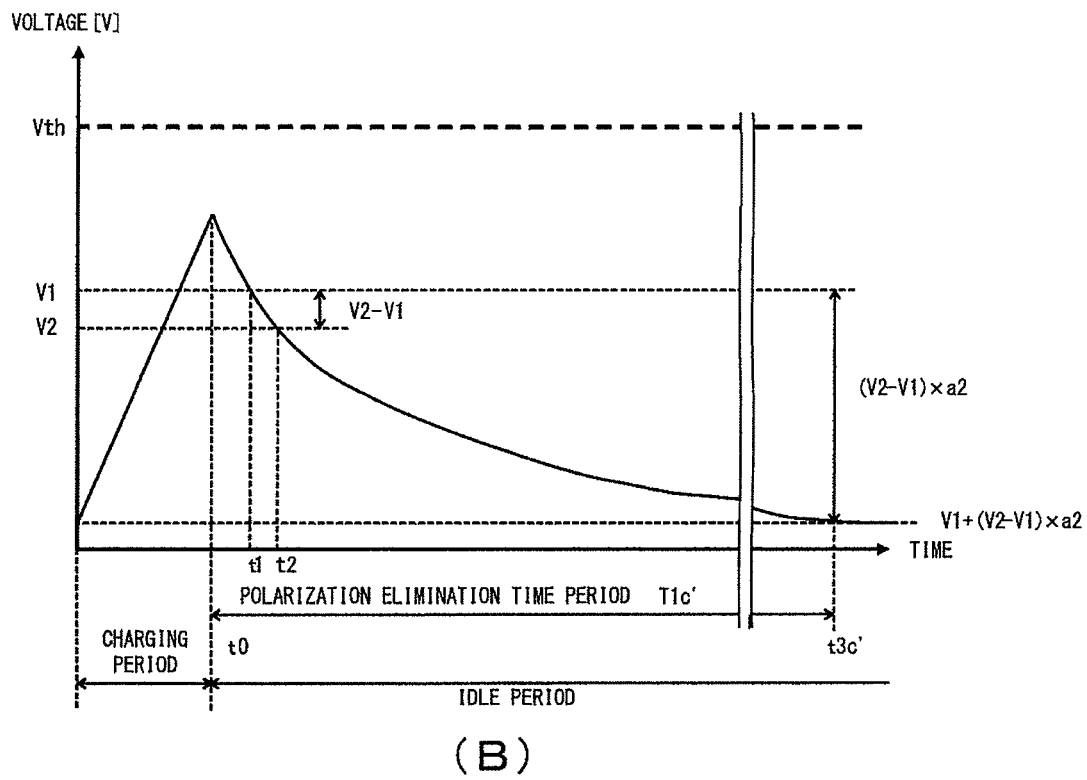

In the case of charging, a polarization elimination time period T1c' provided when the open-circuit voltage at charging end time t0 is equal to or less than voltage threshold Vth (B in FIG. 4) is, as depicted in FIG. 4, longer than a polarization elimination time period T1c provided when the open-circuit voltage at charging end time t0 is greater than voltage threshold Vth (A in FIG. 4). Accordingly, polarization elimination time period T1c' is longer than polarization elimination time period T1c when an open-circuit voltage at charging end time t0 is equal to or lower than voltage threshold Vth, and hence a temporal variation in the open-circuit voltage during polarization elimination time period T1c' is less significant than a temporal variation in the open-circuit voltage that would be seen when the open-circuit voltage at charging end time t0 is higher than voltage threshold Vth. Thus, the amount of change made when an open-circuit voltage at charging end time t0 is equal to or lower than voltage threshold Vth is smaller than the amount of change that would be made when the open-circuit voltage at charging end time t0 is greater than voltage threshold Vth. Accordingly, the estimation coefficient is set to estimation coefficient a2 when voltage V1 or V2 is equal to or less than voltage threshold Vth, and the estimation coefficient is set to estimation coefficient a1, which is lower than estimation coefficient a2, when voltage V1 or V2 is greater than voltage threshold Vth.

FIG. 4 illustrates implementations of temporal variations in a voltage during a charging period and a polarization elimination time period after the end of charging. A in FIG. 4 indicates a temporal variation in a voltage seen during a charging period and a polarization elimination time period T1c after the end of charging (time period extending from time t0 to time t3c) when the open-circuit voltage at charging end time t0 is greater than voltage threshold Vth and voltages V1 and V2 are greater than voltage threshold Vth. For example, A indicates a temporal variation in a voltage seen during a charging period and a polarization elimination time period after the end of charging when voltages V1 and V2 is greater than 3.4 [V], i.e., the voltage threshold Vth depicted in FIG. 2 (3.4 [V]<V1, V2≤3.95 [V]). B in FIG. 4 indicates a temporal variation in a voltage seen during a charging period and a polarization elimination time period T1c' after the end of charging (time period extending from time t0 to time t3c') when the open-circuit voltage at charging end time t0 is equal to or less than voltage threshold Vth and voltages V1 and V2 are equal to or less than voltage threshold Vth. For example, B indicates a temporal variation in a voltage seen during a charging period and a polarization elimination time period after the end of charging when voltages V1 and V2 are equal to or lower than 3.4 [V], i.e., the voltage threshold Vth depicted in FIG. 2 (2.9 [V]≤V1, V2≤3.4 [V]).

Voltage threshold Vth is, for example, the open-circuit voltage OCV depicted in FIG. 2, i.e., 3.4 [V]. Voltage threshold Vth may be a voltage threshold Vth1 (first voltage threshold) to be compared with voltage V1 or may be voltage threshold Vth2 (second voltage threshold≥voltage threshold Vth1) to be compared with voltage V2. In this case, the control circuit 3 may set estimation coefficient a2 as the estimation coefficient when voltage V1 is equal to or less than voltage threshold Vth1 and set estimation coefficient a1, which is lower than estimation coefficient a2, as the estimation coefficient when voltage V1 is greater than voltage threshold Vth1. Alternatively, the control circuit 3 may set estimation coefficient a2 as the estimation coefficient when voltage V2 is equal to or less than voltage threshold Vth2 and set estimation coefficient a1, which is lower than estimation coefficient a2, as the estimation coefficient when voltage V2 is greater than voltage threshold Vth2.

(A5) The control circuit 3 may set estimation coefficient a2 as the estimation coefficient when the amount of change is equal to or less than an amount-of-change threshold and set estimation coefficient a1, which is lower than estimation coefficient a2, as the estimation coefficient when the amount of change is greater than the amount-of-change threshold.

The reason is the same as that for (A2). Accordingly, the estimation coefficient is set to estimation coefficient a2 when the amount of change is equal to or less than the amount-of-change threshold, and the estimation coefficient is set to estimation coefficient a1, which is lower than estimation coefficient a2, when the amount of change is greater than the amount-of-change threshold.

The amount-of-change threshold is determined through an experiment or a simulation. For example, when the open-circuit voltage at charging or discharging end time t0 is 3.4 [V], voltages V1 and V2 may be determined to obtain, as the amount-of-change threshold, an amount of change based on the determined voltages V1 and V2.

(A6) The control circuit 3 sets estimation coefficient a2 as the estimation coefficient when an inclination calculated on the basis of an amount of change and a state-of-charge change amount is greater than an inclination threshold, and sets estimation coefficient a1, which is lower than estimation coefficient a2, as the estimation coefficient when the inclination is equal to or less than the inclination threshold.

The reason is similar to that for (A3). Accordingly, when the inclination (amount of change/state-of-charge change amount) is greater than the inclination threshold, voltages V1 and V2 fall within a range with a low open-circuit voltage, and hence estimation coefficient a2 is set as the estimation coefficient. By contrast, when the inclination is equal to or less than the inclination threshold, voltages V1 and V2 fall within a range with a high open-circuit voltage, and hence estimation coefficient a1, which is lower than estimation coefficient a2, is set as the estimation coefficient.

The inclination threshold is determined through an experiment or a simulation. For example, an inclination determined on the basis of the above-described amount of change in open-circuit voltage OCV (3.4 [V]−2.9 [V]) and state-of-charge change amount (10 [%]−0 [%]) depicted in FIG. 2 may be the inclination threshold.

In addition, in the processes (A4)-(A6) described above, estimation coefficient a1 may be a fixed value, and estimation coefficient a1 may be multiplied by weighting coefficient b so as to calculate estimation coefficient a2.

(A7) The control circuit 3 changes estimation coefficient a according to the temperature of the body of the battery 4 or the temperature of a space around the battery 4 (temperature of the battery 4). In particular, the battery 4 having a lower temperature causes the control circuit 3 to set estimation coefficient a to a higher value. The battery 4 having a higher temperature causes the control circuit 3 to set estimation coefficient a to a lower value.

Estimation coefficient a is changed according to the temperature of the battery 4 because in, for example, a case where the temperature of the battery 4 is different while the open-circuit voltage at charging or discharging end time t0 remains the same, when the temperature of the battery 4 is lower than a reference temperature (e.g., ordinary temperature), the polarization elimination time period provided when the temperature of the battery 4 is lower than the reference temperature is longer than a polarization elimination time period that would be provided when the temperature of the battery 4 is the reference temperature. Hence, the temporal variation in the open-circuit voltage that is seen during the polarization elimination time period when the temperature of the battery 4 is lower than the reference temperature is less significant than a temporal variation that would be seen when the temperature of the battery 4 is the reference temperature. Accordingly, the amount of change in the temperature provided when the temperature of the battery 4 is lower than the reference temperature is smaller than an amount of change that would be provided when the temperature of the battery 4 is the reference temperature, and hence the estimation coefficient a provided when the temperature of the battery 4 is lower than the reference temperature is set to a value that is higher than an estimation coefficient a that would be provided when the temperature of the battery 4 is the reference temperature. The polarization elimination time period provided when the temperature of the battery 4 is higher than the reference temperature is shorter than a polarization elimination time period that would be provided when the temperature of the battery 4 is the reference temperature. Hence, the temporal variation in the open-circuit voltage that is seen during the polarization elimination time period when the temperature of the battery 4 is higher than the reference temperature is more significant than a temporal variation that would be seen when the temperature of the battery 4 is the reference temperature. Accordingly, the amount of change in the temperature provided when the temperature of the battery 4 is higher than the reference temperature is larger than an amount of change that would be provided when the temperature of the battery 4 is the reference temperature, and hence the estimation coefficient a provided when the temperature of the battery 4 is higher than the reference temperature is set to a value that is lower than an estimation coefficient a that would be provided when the temperature of the battery 4 is the reference temperature.

By setting an estimation coefficient as described in (A1)-(A7), the accuracy in estimation of an open-circuit voltage to be provided after a polarization elimination time period can be increased. Since the accuracy in estimation of an open-circuit voltage can be increased, the accuracy in estimation of a state of charge to be provided after a polarization elimination time period can also be increased.

The temperature of the battery 4 may be measured at, for example, charging or discharging end time t0, time t1, time t2, or a time between charging or discharging end time t0 and time t2. The temperature of the battery 4 may be the average of the temperatures measured at times t1 and t2.

When one of the temperatures measured at charging or discharging end time t0, time t1 (first time), and time t2 (second temperature) or the average of the temperatures measured at times t1 and t2 is equal to or less than a temperature threshold, the control circuit 3 sets a first estimation coefficient as estimation coefficient a; and when one of the temperatures measured at charging or discharging end time t0, time t1, and time t2 or the average of the temperatures measured at times t1 and t2 is lower than the temperature threshold, the control circuit 3 sets a second estimation coefficient, which is lower than the first estimation coefficient, as estimation coefficient a.

(A7-1) The control circuit 3 may set estimation coefficient a in accordance with voltage V1 and temperature. Alternatively, the control circuit 3 may set estimation coefficient a in accordance with voltage V2 and temperature. In particular, estimation coefficient a is set by combining the setting of the estimation coefficient a described above with reference to (A1) and the setting of the estimation coefficient a described above with reference to (A7) that depends on the temperature of the battery 4.

This is because the temporal variation in the open-circuit voltage is changed according to the temperature of the battery 4, as described above with reference to (A7). In (A1), estimation coefficient a is set using only voltage V1 or V2 for one temperature (e.g., reference temperature only); and in (A7-1), estimation coefficient a is set using the temperature of the battery 4 and a voltage V1 or V2 corresponding to this temperature.

Figure 5:
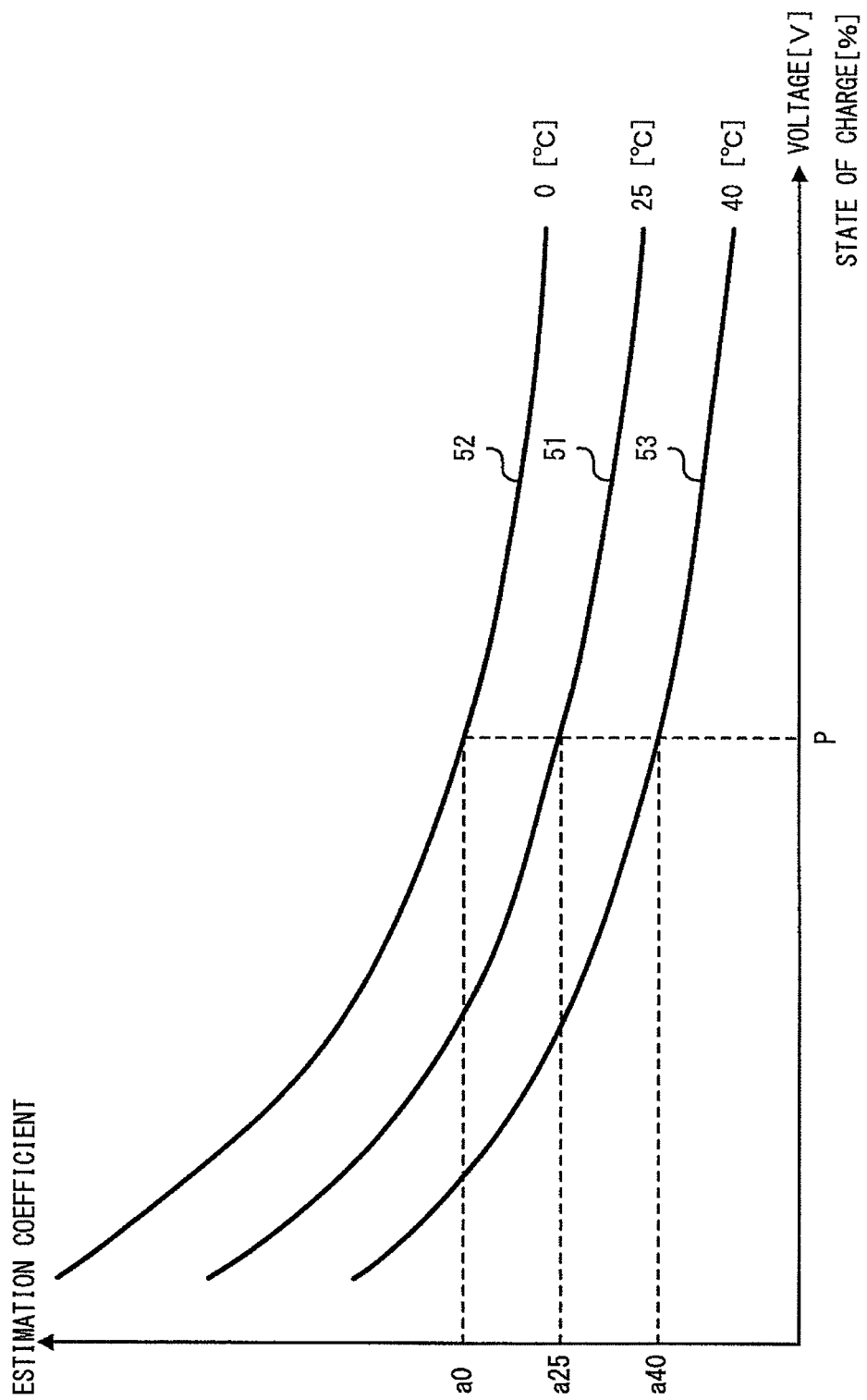
FIG. 5 illustrates, for some temperatures, a relationship between an estimation coefficient and a voltage or a relationship between an estimation coefficient and a state of charge.

FIG. 5 illustrates, for some temperatures, a relationship between estimation coefficient a and a voltage or a relationship between estimation coefficient a and a state of charge. In the example depicted in FIG. 5, a reference temperature is 25 [° C.], a temperature lower than the reference temperature is 0 [° C.], and a temperature higher than the reference temperature is 40 [° C.]. A curve 51 indicates a temporal variation in estimation coefficient a that is seen when the temperature is 25 [° C.], a curve 52 indicates a temporal variation in estimation coefficient a that is seen when the temperature is 0 [° C.], and a curve 53 indicates a temporal variation in estimation coefficient a that is seen when the temperature is 40 [° C.]. For ease of description, the temperatures in the example of FIG. 5 are 25 [° C.], 0 [° C.], and 40 [° C.]. However, the present invention is not limited to the three temperatures.

When, for example, FIG. 5 illustrates, for some temperatures, a relationship between estimation coefficient a and voltage V1, the vertical axis indicates estimation coefficient a, and the horizontal axis indicates voltage V1 [V]. Accordingly, for an identical voltage V1 (P in FIG. 5) as depicted in FIG. 5, when the temperature of the battery 4 is 0 [° C.], which is lower than the reference temperature of 25 [° C.], an estimation coefficient a0 corresponding to 0 [° C.], which is higher than an estimation coefficient a25 corresponding to 25 [° C.], is set as estimation coefficient a, and when the temperature of the battery 4 is 40 [° C.], which is higher than the reference temperature of 25 [° C.], an estimation coefficient a40 corresponding to 40 [° C.], which is lower than the estimation coefficient a25 corresponding to 25 [° C.], is set as the estimation coefficient.

When, for example, FIG. 5 illustrates, for some temperatures, a relationship between estimation coefficient a and voltage V2, the vertical axis indicates estimation coefficient a, and the horizontal axis indicates voltage V2 [V]. Accordingly, for an identical voltage V2 (P in FIG. 5) as depicted in FIG. 5, when the temperature of the battery 4 is 0 [° C.], which is lower than the reference temperature of 25 [° C.], an estimation coefficient a0 corresponding to 0 [° C.], which is higher than an estimation coefficient a25 corresponding to 25 [° C.], is set as estimation coefficient a, and when the temperature of the battery 4 is 40 [° C.], which is higher than the reference temperature of 25 [° C.], an estimation coefficient a40 corresponding to 40 [° C.], which is lower than the estimation coefficient a25 corresponding to 25 [° C.], is set as estimation coefficient a.

By setting, as described above, an estimation coefficient in accordance with voltage V1 and the temperature or in accordance with voltage V2 and the temperature, the accuracy in estimation of an open-circuit voltage to be provided after a polarization elimination time period can be increased in comparison with the situation described in (A1).

The control circuit 3 may set estimation coefficient a in accordance with "amount of change and temperature", "inclination and temperature", or "inclination and inclination threshold".

Alternatively, the control circuit 3 may set estimation coeffect a1 or a2 in accordance with "voltage V1, voltage threshold Vth1, and temperature", "voltage V2, voltage threshold Vth2, and temperature", or "amount of change and amount-of-change threshold".

(A8) The control circuit 3 changes estimation coefficient a in accordance with the degree of deterioration. In particular, the degree of deterioration having a higher value at the time of start of charging causes the control circuit 3 to set estimation coefficient a to a higher value. The degree of deterioration having a lower value at the time of start of charging causes the control circuit 3 to set estimation coefficient a to a lower value. Alternatively, when the degree of deterioration at the time of start of charging is equal to or less than a first degree-of-deterioration threshold, the control circuit 3 may set a first estimation coefficient as estimation coefficient a; and when the degree of deterioration at the time of start of charging is greater than the first degree-of-deterioration threshold, the control circuit 3 may set a second estimation coefficient, which is higher than the first estimation coefficient, as estimation coefficient a. The degree of deterioration at the time of start of charging is, for example, an internal resistance determined using the voltage difference between a voltage measured before a charging start time and a voltage measured after the charging start time and a current measured after the charging start time. An internal-resistance rise rate may be used as the degree of deterioration.

Estimation coefficient a is changed in accordance with the degree of deterioration because in a case where the degree of deterioration of the battery 4 is different while the open-circuit voltage at charging or discharging end time t0 remains the same, the polarization elimination time period is long when the degree of deterioration of the battery 4 is high, and the polarization elimination time period is short when the degree of deterioration of the battery 4 is low. Hence, the temporal variation in the open-circuit voltage that is seen during the polarization elimination time period when the degree of deterioration of the battery 4 is high is less significant than a temporal variation that would be seen when the degree of deterioration of the battery 4 is low. Hence, the amount of change made when the degree of deterioration is high is smaller than an amount of change that would be made when the degree of deterioration is low, and hence when the degree of deterioration is high, estimation coefficient a is set to a value that is higher than an estimation coefficient a that would be provided when the degree of deterioration is low.

By setting an estimation coefficient in accordance with the degree of deterioration as described above, the accuracy in estimation of an open-circuit voltage to be provided after a polarization elimination time period can be increased. Since the accuracy in estimation of an open-circuit voltage can be increased, the accuracy in estimation of a state of charge to be provided after a polarization elimination time period can also be increased.

The degree of deterioration at the time of end of charging or discharging having a higher value causes the control circuit 3 to set estimation coefficient a to a higher value. The degree of deterioration at the time of end of charging or discharging having a lower value causes the control circuit 3 to set estimation coefficient a to a lower value. Alternatively, the control circuit 3 may set a first estimation coefficient as estimation coefficient a when the degree of deterioration at the time of end of charging or discharging is equal to or less than a second degree-of-deterioration threshold and set a second estimation coefficient, which is higher than the first estimation coefficient, as estimation coefficient a when the degree of deterioration at the time of end of charging or discharging is greater than the second degree-of-deterioration threshold. The degree of deterioration at the time of end of charging or discharging is, for example, an internal resistance determined using the voltage difference between a voltage measured before a charging or discharging end time and a voltage measured after the charging or discharging end time and a current measured before the charging or discharging end time. An internal-resistance rise rate may be used as the degree of deterioration.

The degree of deterioration at a charging or discharging end time is used because the degree of deterioration determined at the charging or discharging end time is more accurate than a degree of deterioration determined at a charging start time.

By setting an estimation coefficient in accordance with the degree of deterioration at the time of end of charging or discharging as described above, the accuracy in estimation of an open-circuit voltage to be provided after a polarization elimination time period can be increased. Since the accuracy in estimation of an open-circuit voltage can be increased, the accuracy in estimation of a state of charge to be provided after a polarization elimination time period can also be increased.

(A8-1) The control circuit 3 sets estimation coefficient a in accordance with voltage V1 and the degree of deterioration at the time of start of charging or the time of end of charging or discharging. Alternatively, the control circuit 3 may set estimation coefficient a in accordance with voltage V2 and the degree of deterioration at the time of start of charging or the time of end of charging or discharging. In particular, estimation coefficient a is set by combining the setting of the estimation coefficient a described above with reference to (A1) and the setting of the estimation coefficient a described above with reference to (A8) that depends on the degree of deterioration of the battery 4.

This is because the temporal variation in the open-circuit voltage is changed in accordance with the degree of deterioration of the battery 4, as described above with reference to (A8). In (A1), estimation coefficient a is set using only voltage V1 or V2 for one degree of deterioration (e.g., the degree of deterioration of an early internal resistance only); and in (A8-1), estimation coefficient a is set using the degree of deterioration of the battery 4 and a voltage V1 or V2 corresponding to this degree of deterioration.

Figure 6:
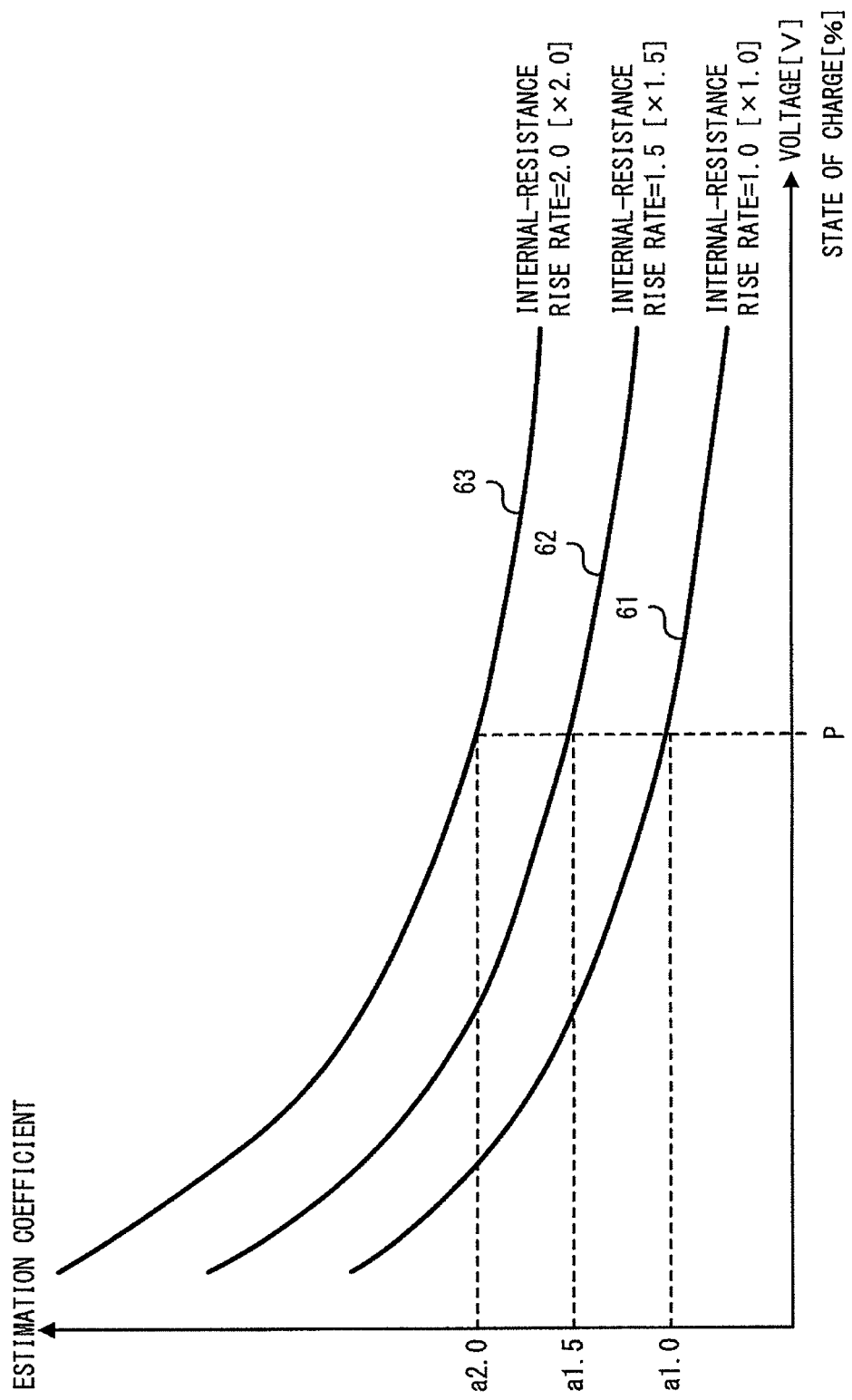
FIG. 6 illustrates, for some degrees of deterioration, a relationship between an estimation coefficient and a voltage or a relationship between an estimation coefficient and a state of charge.

FIG. 6 illustrates, for some degrees of deterioration, a relationship between estimation coefficient a and a voltage or a relationship between estimation coefficient a and a state of charge. In the example depicted in FIG. 6, internal-resistance rise rates of 1.0 [×1.0] (a rise rate with reference to an early internal resistance), 1.5 [×1.5], and 2.0 [×2.0] are used as degrees of deterioration. A curve 61 indicates a temporal variation in estimation coefficient a that is seen when the internal-resistance rise rate is 1.0 [×1.0], a curve 62 indicates a temporal variation in estimation coefficient a that is seen when the internal-resistance rise rate is 1.5 [×1.5], and a curve 63 indicates a temporal variation in estimation coefficient a that is seen when the internal-resistance rise rate is 2.0 [×2.0]. For ease of description, the internal-resistance rise rates in the example of FIG. 6 are 1.0 [×1.0], 1.5 [×1.5], and 2.0 [×2.0]. However, the present invention is not limited to the three internal-resistance rise rates.

When, for example, FIG. 6 illustrates, for some degrees of deterioration, a relationship between estimation coefficient a and voltage V1, the vertical axis indicates estimation coefficient a, and the horizontal axis indicates voltage V1 [V]. Accordingly, for an identical voltage V1 (P in FIG. 6) as depicted in FIG. 6, when the degree of deterioration of the battery 4 is an internal-resistance rise rate of 1.0 [×1.0], estimation coefficient a is set to an estimation coefficient a1.0 corresponding to an internal-resistance rise rate of 1.0 [×1.0], which is lower than estimation coefficients a1.5 and a2.0 corresponding to internal-resistance rise rates of 1.5 [×1.5] and 2.0 [×2.0]. When the degree of deterioration of the battery 4 is an internal-resistance rise rate of 2.0 [×2.0], estimation coefficient a is set to the estimation coefficient a2.0 corresponding to an internal-resistance rise rate of 2.0 [×2.0], which is higher than the estimation coefficients a1.5 and a1.0 corresponding to internal-resistance rise rates of 1.5 [×1.5] and 1.0 [×1.0].

When, for example, FIG. 6 illustrates, for some degrees of deterioration, a relationship between estimation coefficient a and voltage V2, the vertical axis indicates estimation coefficient a, and the horizontal axis indicates voltage V2 [V]. Accordingly, for an identical voltage V2 (P in FIG. 6) as depicted in FIG. 6, when the degree of deterioration of the battery 4 is an internal-resistance rise rate of 1.0 [×1.0], estimation coefficient a is set to the estimation coefficient a1.0 corresponding to an internal-resistance rise rate of 1.0 [×1.0], which is lower than the estimation coefficients a1.5 and a2.0 corresponding to internal-resistance rise rates of 1.5 [×1.5] and 2.0 [×2.0]. When the degree of deterioration of the battery 4 is an internal-resistance rise rate of 2.0 [×2.0], estimation coefficient a is set to the estimation coefficient a2.0 corresponding to an internal-resistance rise rate of 2.0 [×2.0], which is higher than the estimation coefficients a1.5 and a1.0 corresponding to internal-resistance rise rates of 1.5 [×1.5] and 1.0 [×1.0].

By setting an estimation coefficient in accordance with voltage V1 and the degree of deterioration at the time of start of charging or at the time of end of charging or discharging or by setting an estimation coefficient in accordance with voltage V2 and the degree of deterioration at the time of start of charging or at the time of end of charging or discharging, as described above, the accuracy in estimation of an open-circuit voltage to be provided after a polarization elimination time period can be increased in comparison with the situation described in (A1). Since the accuracy in estimation of an open-circuit voltage to be provided after a polarization elimination time period can be increased, the accuracy in estimation of a state of charge to be provided after the polarization elimination time period can also be increased.

The control circuit 3 may set estimation coefficient a in accordance with "amount of change and degree of deterioration at the time of start of charging or the time of end of charging or discharging", "inclination and degree of deterioration at the time of start of charging or the time of end of charging or discharging", or "inclination, inclination threshold, and degree of deterioration at the time of start of charging or the time of end of charging or discharging".

Alternatively, the control circuit 3 may set estimation coefficient a1 or a2 in accordance with "voltage V1, voltage threshold Vth1, and degree of deterioration at the time of start of charging or the time of end of charging or discharging", "voltage V2, voltage threshold Vth2, and degree of deterioration at the time of start of charging or the time of end of charging or discharging", or "amount of change, amount-of-change threshold, and degree of deterioration at the time of start of charging or the time of end of charging or discharging".

(B) Estimation Based on State of Charge

During a polarization elimination time period T1 extending from a charging or discharging end time t0 of the battery 4 to a polarization-eliminated time t3 at which polarization of the battery 4 can be judged to have been eliminated, the control circuit 3 obtains, as an amount of change, the difference between a voltage V1 of the battery 4 measured at time t1 and a voltage V2 of the battery 4 measured at a time t2 following-time t1 (=V2−V1), and multiplies the amount of change by an estimation coefficient a that depends on a state of charge SOC1 (first state of charge) corresponding to voltage V1 or a state of charge SOC2 (second state of charge) corresponding to voltage V2, and sums the value obtained in the multiplication and voltage V1 so as to estimate an open-circuit voltage to be provided after elimination of the polarization of the battery 4. See formula 1.

Alternatively, during polarization elimination time period T1, the control circuit 3 may obtain, as an amount of change, the difference between voltage V1 (first voltage) and voltage V2 (second voltage) (=V2−V1), and multiply the amount of change by an estimation coefficient a that depends on a state of charge SOC1 (first state of charge) corresponding to voltage V1 or a state of charge SOC2 (second state of charge) corresponding to voltage V2, and sum the value obtained in the multiplication and voltage V2 so as to estimate an open-circuit voltage OCV1 to be provided after elimination of the polarization of the battery 4. See formula 1'. State of charge SOC1 is determined on the basis of voltage V1. State of charge SOC2 is determined on the basis of voltage V2. For example, information related to OCV-SOC characteristics such as that depicted in FIG. 2 may be stored in a storage part in advance so as to determine a state of charge corresponding to the measured voltage V1 or V2 by using the OCV-SOC characteristics.

The following describes the setting of an estimation coefficient in (B).

(B1) State of charge SOC1 or SOC2 having a lower value causes the control circuit 3 to set a higher value as estimation coefficient a. State of charge SOC1 or SOC2 having a higher value causes the control circuit 3 to set a lower value as estimation coefficient a.

This is because a polarization elimination time period provided when the state of charge at charging or discharging end time t0 is low is longer than a polarization elimination time period that would be provided when the state of charge at charging or discharging end time t0 is high. Accordingly, a polarization elimination time period is extended when a state of charge at charging or discharging end time t0 is low, and hence a temporal variation in the state of charge during the polarization elimination time period is less significant than the temporal variation in the state of charge that would be seen when the state of charge at charging or discharging end time t0 is high. Thus, the state-of-charge change amount provided when a state of charge at charging or discharging end time t0 is low is smaller than the state-of-charge change amount that would be provided when the state of charge at charging or discharging end time t0 is high. Accordingly, an amount of change in a voltage corresponding to a state-of-charge change amount provided when the state of charge at charging or discharging end time t0 is low is smaller than an amount of change in a voltage corresponding to a state-of-charge change amount that would be provided when the state of charge at charging or discharging end time t0 is high. Accordingly, state of charge SOC1 or SOC2 having a lower value causes a higher value to be set as estimation coefficient a, and state of charge SOC1 or SOC2 having a higher value causes a lower value to be set as estimation coefficient a.

(B2) The state-of-charge change amount (=SOC2−SOC1) having a lower value causes the control circuit 3 to set a higher value as estimation coefficient a. The state-of-charge change amount having a higher value causes the control circuit 3 to set a lower value as estimation coefficient a.

This is because, as in the case of (B1), a state-of-charge change amount provided when the state of charge at charging or discharging end time t0 is low is smaller than a state-of-charge change amount that would be provided when the state of charge at charging or discharging end time t0 is high. Thus, an amount of change in a voltage corresponding to a state-of-charge change amount provided when the state of charge at charging or discharging end time t0 is low is smaller than an amount of change in a voltage corresponding to a state-of-charge change amount that would be provided when the state of charge at charging or discharging end time t0 is high. Accordingly, the state-of-charge change amount having a lower value causes a higher value to be set as estimation coefficient a, and the state-of-charge change amount having a higher value causes a lower value to be set as estimation coefficient a.

(B3) The inclination calculated on the basis of the amount of change and the state-of-charge change amount having a higher value causes the control circuit 3 to set a higher value as estimation coefficient a. The inclination having a lower value causes the control circuit 3 to set a lower value as estimation coefficient a.

This is because, as in the case of (A3), the inclination is large for a range in which the open-circuit voltage and the state of charge are low and is small for a range in which the open-circuit voltage and the state of charge are high. Accordingly, when the inclination is large, states of charge SOC1 and SOC2 fall within a range with a low state of charge, and hence a larger inclination causes a higher value to be set as estimation coefficient a. By contrast, when the inclination is small, states of charge SOC1 and SOC2 fall within a range with a high state of charge, and hence a smaller inclination causes a lower value to be set as estimation coefficient a.

(B4) The control circuit 3 may set estimation coefficient a2 (first estimation coefficient) as the estimation coefficient when state of charge SOC1 or SOC2 is equal to or less than state-of-charge threshold SOCth and set an estimation coefficient a1 (second estimation coefficient) lower than estimation coefficient a2 as the estimation coefficient when state of charge SOC1 or SOC2 is greater than state-of-charge threshold SOCth.

This is because, as in the case of (B1), a polarization elimination time period provided when the state of charge at charging or discharging end time t0 is equal to or less than state-of-charge threshold SOCth is longer than a polarization elimination time period that would be provided when the state of charge at charging or discharging end time t0 is greater than state-of-charge threshold SOCth. Accordingly, a polarization elimination time period is extended when a state of charge at charging or discharging end time t0 is equal to or less than state-of-charge threshold SOCth, and hence a temporal variation in the state of charge during the polarization elimination time period is less significant than the temporal variation in the state of charge that would be seen when the state of charge at charging or discharging end time t0 is high. Thus, the state-of-charge change amount provided when a state of charge at charging or discharging end time t0 is low is smaller than the state-of-charge change amount that would be provided when the state of charge at charging or discharging end time t0 is high. Accordingly, an amount of change in a voltage corresponding to a state-of-charge change amount provided when the state of charge at charging or discharging end time t0 is low is smaller than an amount of change in a voltage corresponding to a state-of-charge change amount that would be provided when the state of charge at charging or discharging end time t0 is high. Accordingly, state of charge SOC1 or SOC2 having a lower value causes a higher value to be set as estimation coefficient a, and state of charge SOC1 or SOC2 having a higher value causes a lower value to be set as estimation coefficient a.

State-of-charge threshold SOCth is, for example, the state of charge SOC10 [%] depicted in FIG. 2. State-of-charge threshold SOCth may be a state-of-charge threshold SOCth1 (first state-of-charge threshold) to be compared with state of charge SOC1 or may be a state-of-charge threshold SOCth2 (second state-of-charge threshold state-of-charge threshold SOCth1) to be compared with state of charge SOC2. In this case, the control circuit 3 may set estimation coefficient a2 as the estimation coefficient when state of charge SOC1 is equal to or less than state-of-charge threshold SOCth1 and set estimation coefficient a1, which is lower than estimation coefficient a2, as the estimation coefficient when state of charge SOC1 is greater than state-of-charge threshold SOCth1. Alternatively, the control circuit 3 may set estimation coefficient a2 as the estimation coefficient when state of charge SOC2 is equal to or less than state-of-charge threshold SOCth2 and set estimation coefficient a1, which is lower than estimation coefficient a2, as the estimation coefficient when state of charge SOC2 is greater than state-of-charge threshold SOCth2.

(B5) The control circuit 3 sets estimation coefficient a2 as the estimation coefficient when the state-of-charge change amount is equal to or less than a state-of-charge-change-amount threshold and sets estimation coefficient a1, which is lower than estimation coefficient a2, as the estimation coefficient when the state-of-charge change amount is greater than the state-of-charge-change-amount threshold.

This is because, as in the case of (B2), a state-of-charge change amount provided when the state of charge at charging or discharging end time t0 is equal to or less than a state-of-charge-charge-amount threshold is smaller than a state-of-charge change amount that would be provided when the state of charge at charging or discharging end time t0 is greater than the state-of-charge-charge-amount threshold. Thus, an amount of change in a voltage corresponding to a state-of-charge change amount provided when the state of charge at charging or discharging end time t0 is equal to or less than the state-of-charge-charge-amount threshold is smaller than an amount of change in a voltage corresponding to a state-of-charge change amount that would be provided when the state of charge at charging or discharging end time t0 is greater than the state-of-charge-charge-amount threshold. Accordingly, the estimation coefficient is estimation coefficient a2 when the state-of-charge change amount is equal to or less than the state-of-charge-change-amount threshold, and the estimation coefficient is estimation coefficient a1, which is lower than estimation coefficient a2, when the state-of-charge change amount is greater than the state-of-charge-change-amount threshold.

(B6) The control circuit 3 sets estimation coefficient a2 as the estimation coefficient when an inclination calculated on the basis of an amount of change and a state-of-charge change amount is greater than an inclination threshold, and sets estimation coefficient a1, which is lower than estimation coefficient a2, as the estimation coefficient when the inclination is equal to or less than the inclination threshold.

This is because, as in the case of (B3), when the inclination is greater than the inclination threshold, states of charge SOC1 and SOC2 fall within a range with a low state of charge, and hence estimation coefficient a2 is set as the estimation coefficient. By contrast, when the inclination is equal to or less than the inclination threshold, states of charge SOC1 and SOC2 fall within a range with a high state of charge, and hence estimation coefficient a1, which is lower than estimation coefficient a2, is set as the estimation coefficient.

By setting an estimation coefficient as described in (B1)-(B6), the accuracy in estimation of an open-circuit voltage to be provided after a polarization elimination time period can be increased. Since the accuracy in estimation of an open-circuit voltage to be provided after a polarization elimination time period can be increased, the accuracy in estimation of a state of charge to be provided after the polarization elimination time period can also be increased.

(B7) The control circuit 3 performs a control similar to that in (A7). (B7-1) The control circuit 3 may set estimation coefficient a in accordance with state of charge SOC1 and the temperature. Alternatively, the control circuit 3 may set estimation coefficient a in accordance with state of charge SOC2 and the temperature. In particular, estimation coefficient a is set by combining the setting of the estimation coefficient a described above with reference to (B1) and the setting of the estimation coefficient a described above with reference to (B7) that depends on the temperature of the battery 4.

When, for example, FIG. 5 illustrates, for some temperatures, a relationship between estimation coefficient a and state of charge SOC1, the vertical axis indicates estimation coefficient a, and the horizontal axis indicates state of charge SOC1 [%]. Accordingly, for an identical state of charge SOC1 (P in FIG. 5) as depicted in FIG. 5, when the temperature of the battery 4 is 0 [° C.], which is lower than the reference temperature of 25 [° C.], an estimation coefficient a0 corresponding to 0 [° C.], which is higher than an estimation coefficient a25 corresponding to 25 [° C.], is set as estimation coefficient a, and when the temperature of the battery 4 is 40 [° C.], which is higher than the reference temperature of 25 [° C.], an estimation coefficient a40 corresponding to 40 [° C.], which is lower than the estimation coefficient a25 corresponding to 25 [° C.], is set as the estimation coefficient.

When, for example, FIG. 5 illustrates, for some temperatures, a relationship between estimation coefficient a and state of charge SOC2, the vertical axis indicates estimation coefficient a, and the horizontal axis indicates state of charge SOC2 [%]. Accordingly, for an identical state of charge SOC2 (P in FIG. 5) as depicted in FIG. 5, when the temperature of the battery 4 is 0 [° C.], which is lower than the reference temperature of 25 [° C.], an estimation coefficient a0 corresponding to 0 [° C.], which is higher than an estimation coefficient a25 corresponding to 25 [° C.], is set as estimation coefficient a, and when the temperature of the battery 4 is 40 [° C.], which is higher than the reference temperature of 25 [° C.], an estimation coefficient a40 corresponding to 40 [° C.], which is lower than the estimation coefficient a25 corresponding to 25 [° C.], is set as estimation coefficient a.

By setting an estimation coefficient in accordance with state of charge SOC1 and the temperature or setting an estimation coefficient in accordance with state of charge SOC2 and the temperature, as described above, the accuracy in estimation of an open-circuit voltage to be provided after a polarization elimination time period can be increased in comparison with the situation described in (B1). (B8) The control circuit 3 performs a control similar to that in (A8). (B8-1) The control circuit 3 may set estimation coefficient a in accordance with state of charge SOC1 and the degree of deterioration at the time of start of charging or the time of end of charging or discharging. Alternatively, the control circuit 3 may set estimation coefficient a in accordance with state of charge SOC2 and the degree of deterioration at the time of start of charging or the time of end of charging or discharging. In particular, estimation coefficient a is set by combining the setting of the estimation coefficient a described above with reference to (B1) and the setting of the estimation coefficient a described above with reference to (B8) that depends on the degree of deterioration of the battery 4.

In (B1), estimation coefficient a is set using only state of charge SOC1 or SOC2 for one degree of deterioration (e.g., the degree of deterioration of an early internal resistance only); and in (B8-1), estimation coefficient a is set using the degree of deterioration of the battery 4 and a state of charge SOC1 or SOC2 corresponding to this degree of deterioration.

When, for example, FIG. 6 illustrates, for some degrees of deterioration, a relationship between estimation coefficient a and state of charge SOC1, the vertical axis indicates estimation coefficient a, and the horizontal axis indicates state of charge SOC1 [%]. Accordingly, for an identical state of charge SOC1 (P in FIG. 6) as depicted in FIG. 6, when the degree of deterioration of the battery 4 is an internal-resistance rise rate of 1.0 [×1.0], estimation coefficient a is set to an estimation coefficient a1.0 corresponding to an internal-resistance rise rate of 1.0 [×1.0], which is lower than estimation coefficients a1.5 and a2.0 corresponding to internal-resistance rise rates of 1.5 [×1.5] and 2.0 [×2.0]. When the degree of deterioration of the battery 4 is an internal-resistance rise rate of 2.0 [×2.0], estimation coefficient a is set to the estimation coefficient a2.0 corresponding to an internal-resistance rise rate of 2.0 [×2.0], which is higher than the estimation coefficients a1.5 and a1.0 corresponding to internal-resistance rise rates of 1.5 [×1.5] and 1.0 [×1.0].

When, for example, FIG. 6 illustrates, for some degrees of deterioration, a relationship between estimation coefficient a and state of charge SOC2, the vertical axis indicates estimation coefficient a, and the horizontal axis indicates state of charge SOC2 [%]. Accordingly, for an identical state of charge SOC2 (P in FIG. 6) as depicted in FIG. 6, when the degree of deterioration of the battery 4 is an internal-resistance rise rate of 1.0 [×1.0], estimation coefficient a is set to the estimation coefficient a1.0 corresponding to an internal-resistance rise rate of 1.0 [×1.0], which is lower than the estimation coefficients a1.5 and a2.0 corresponding to internal-resistance rise rates of 1.5 [×1.5] and 2.0 [×2.0]. When the degree of deterioration of the battery 4 is an internal-resistance rise rate of 2.0 [×2.0], estimation coefficient a is set to the estimation coefficient a2.0 corresponding to an internal-resistance rise rate of 2.0 [×2.0], which is higher than the estimation coefficients a1.5 and a1.0 corresponding to internal-resistance rise rates of 1.5 [×1.5] and 1.0 [×1.0].

By setting an estimation coefficient in accordance with state of charge SOC1 and the degree of deterioration at the time of start of charging or at the time of end of charging or discharging or setting an estimation coefficient in accordance with state of charge SOC2 and the degree of deterioration at the time of start of charging or at the time of end of charging or discharging, as described above, the accuracy in estimation of an open-circuit voltage to be provided after a polarization elimination time period can be increased in comparison with the situation described in (B1).

The following describes an operation of the power storage apparatus 1.

Figure 7:
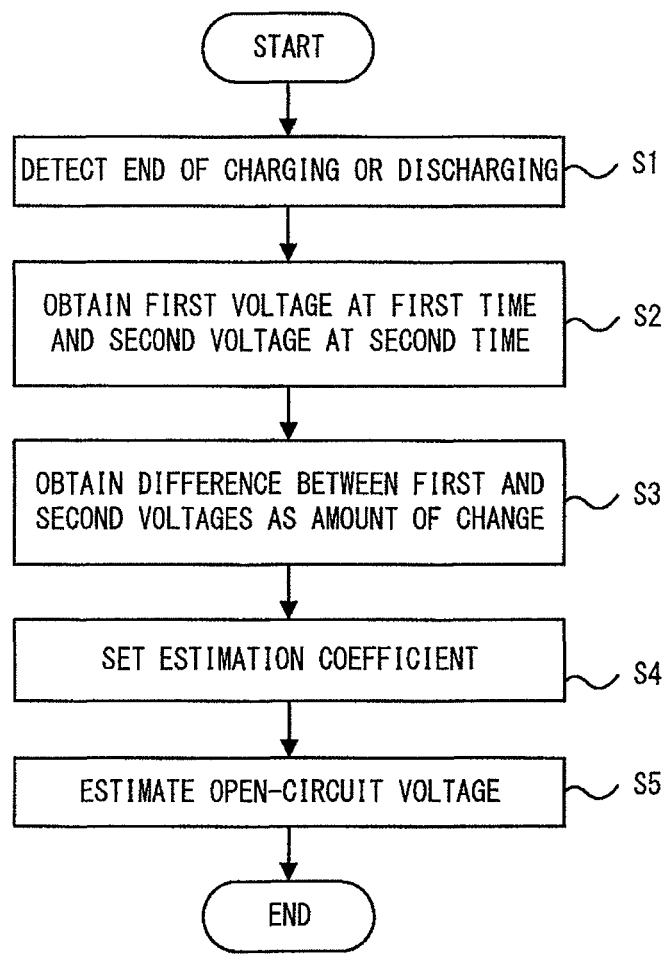
FIG. 7 is a flow diagram illustrating an implementation of an operation of a power storage apparatus.

FIG. 7 is a flow diagram illustrating an implementation of an operation of the power storage apparatus. In step S1, the control circuit 3 detects that charging or discharging has been ended.

In step S2, the control circuit 3 obtains voltages V1 and V2 at times t1 and t2. In particular, a voltage V1 of the battery 4 measured by the voltmeter 5 at time t1 and a voltage V2 of the battery 4 measured by the voltmeter 5 at a time t2 following time t1 are obtained during a polarization elimination time period T1 (T1d in A of FIG. 3, T1d' in B of FIG. 3, T1c in A of FIG. 4, T1c' in B of FIG. 4) extending from a charging or discharging end time t0 of the battery 4 to a polarization-eliminated time t3 (t3d in A of FIG. 3, t3d' in B of FIG. 3, t3c in A of FIG. 4, t3c' in B of FIG. 4) at which polarization of the battery 4 can be judged to have been eliminated.

In the descriptions above, the times t1 and t2 for charging are the same as the times t1 and t2 for discharging. However, the times t1 and t2 for charging are preferably different from the times t1 and t2 for discharging.

In step S2, the control circuit 3 may obtain the temperature of the battery 4.

In step S2, the control circuit 3 may obtain the degree of deterioration at the time of start of charging or the time of end of charging or discharging.

In step S3, the control circuit 3 obtains the difference between voltages V1 and V2 as an amount of change.

In step S4, the control circuit 3 sets an estimation coefficient by using one of the methods described above in (A1)-(B8-1).

In the descriptions above, the estimation coefficients a, a1, and a2 for charging are the same as the estimation coefficients a, a1, and a2 for discharging. However, the estimation coefficients a, a1, and a2 for charging are preferably different from the estimation coefficients a, a1, and a2 for discharging.

In step S5, the control circuit 3 estimates an open-circuit voltage. In particular, the control circuit 3 multiples the estimation coefficient set in step S4 (a, a1, or a2) by the amount of change (=V−V1) and sums the value obtained in the multiplication and voltage V1 or V2 so as to estimate an open-circuit voltage to be provided after elimination of polarization of the battery 4. See formula 1 or 1'.

By performing the processes of steps S1-S5 as described above, the accuracy in estimation of an open-circuit voltage to be provided after a polarization elimination time period can be increased. Since the accuracy in estimation of an open-circuit voltage can be increased, the accuracy in estimation of a state of charge to be provided after a polarization elimination time period can also be increased.

The present invention is not limited to the embodiments described above and can be variously modified or changed without departing from the gist of the invention.

EXPLANATION OF THE CODES

1: Power storage apparatus
2: Assembled battery
3: Control circuit
4: Battery
5: Voltmeter
6: Ammeter
7: Thermometer

The invention claimed is:

1. A power storage apparatus comprising a battery and a control circuit that controls charging and discharging of the battery, wherein
during a polarization elimination time period extending from a battery charging or discharging end time to a polarization-eliminated time at which polarization of the battery is judged to have been eliminated, the control circuit obtains, as an amount of change, a difference between a first voltage of the battery measured at a first time and a second voltage of the battery measured at a second time following the first time, multiplies the amount of change by an estimation coefficient that depends on the first voltage, the second voltage, or a degree of deterioration of the battery, and sums a value obtained in the multiplication and the first or second voltage so as to estimate an open-circuit voltage to be provided after elimination of the polarization of the battery.

2. The power storage apparatus of claim 1, wherein the control circuit
sets a first estimation coefficient as the estimation coefficient when the first voltage is equal to or less than a first voltage threshold and sets a second estimation coefficient as the estimation coefficient when the first voltage is greater than the first voltage threshold, the second estimation coefficient being lower than the first estimation coefficient, or
sets the first estimation coefficient as the estimation coefficient when the second voltage is equal to or less than a second voltage threshold and sets the second estimation coefficient as the estimation coefficient when the second voltage is greater than the second voltage threshold.

3. The power storage apparatus of claim 1, wherein the control circuit sets a first estimation coefficient as the estimation coefficient when the amount of change is equal to or less than an amount-of-change threshold and sets a second estimation coefficient as the estimation coefficient when the amount of change is greater than the amount-of-change threshold, the second estimation coefficient being lower than the first estimation coefficient.

4. The power storage apparatus of claim 1, wherein the control circuit sets a first estimation coefficient as the estimation coefficient when an inclination calculated on the basis of the amount of change and a state-of-charge change amount (amount of change/state-of-charge change amount) is greater than an inclination threshold, and sets a second estimation coefficient as the estimation coefficient when the inclination is equal to or less than the inclination threshold, the state-of-charge change amount being a difference between a first state of charge corresponding to the first voltage and a second state of charge corresponding to the second voltage, the second estimation coefficient being lower than the first estimation coefficient.

5. The power storage apparatus of claim 1, wherein the control circuit
sets a first estimation coefficient as the estimation coefficient when a degree of deterioration at a time of start of charging is equal to or less than a first degree-of-deterioration threshold, and
sets a second estimation coefficient as the estimation coefficient when the degree of deterioration at the time of start of charging is greater than the first degree-of-deterioration threshold, the second estimation coefficient being higher than the first estimation coefficient.

6. The power storage apparatus of claim 1, wherein the control circuit
sets a first estimation coefficient as the estimation coefficient when a degree of deterioration at a time of end of charging or discharging is equal to or less than a second degree-of-deterioration threshold, and
sets a second estimation coefficient as the estimation coefficient when the degree of deterioration at the time of end of charging or discharging is greater than the second degree-of-deterioration threshold, the second estimation coefficient being higher than the first estimation coefficient.

7. A power storage apparatus comprising a battery and a control circuit that controls charging and discharging of the battery, wherein during a polarization elimination time period extending from a battery charging or discharging end time to a polarization-eliminated time at which polarization of the battery is judged to have been eliminated, the control circuit obtains, as an amount of change, a difference between a first voltage of the battery measured at a first time and a second voltage of the battery measured at a second time following the first time, multiplies the amount of change by an estimation coefficient that depends on a first state of charge corresponding to the first voltage or a second state of charge corresponding to the second voltage, and sums a value obtained in the multiplication and the first or second voltage so as to estimate an open-circuit voltage to be provided after elimination of the polarization of the battery.

8. The power storage apparatus of claim 7, wherein the control circuit sets a first estimation coefficient as the estimation coefficient when the first state of charge is equal to or less than a first state-of-charge threshold and sets a second estimation coefficient as the estimation coefficient when the first state of charge is greater than the first state-of-charge threshold, the second estimation coefficient being lower than the first estimation coefficient, or sets a first estimation coefficient as the estimation coefficient when the second state of charge is equal to or less than a second state-of-charge threshold and sets the second estimation coefficient as the estimation coefficient when the second state of charge is greater than the second state-of-charge threshold.

9. The power storage apparatus of claim 7, wherein the control circuit sets a first estimation coefficient as the estimation coefficient when a state-of-charge change amount is equal to or less than a state-of-charge-change-amount threshold and sets a second estimation coefficient as the estimation coefficient when the state-of-charge change amount is greater than the state-of-charge-change-amount threshold, the state-of-charge change amount being a difference between the first and second states of charge, the second estimation coefficient being lower than the first estimation coefficient.

10. The power storage apparatus of claim 7, wherein the control circuit sets a first estimation coefficient as the estimation coefficient when an inclination calculated on the basis of the amount of change and a state-of-charge change amount (amount of change/state-of-charge change amount) is greater than an inclination threshold, and sets a second estimation coefficient as the estimation coefficient when the inclination is equal to or less than the inclination threshold, the state-of-charge change amount being a difference between the first state of charge and the second state of charge, the second estimation coefficient being lower than the first estimation coefficient.

11. The power storage apparatus of claim 7, wherein the control circuit sets a first estimation coefficient as the estimation coefficient when one of temperatures measured at the battery charging or discharging end time, the first time, and the second time or an average of the temperatures measured at the first and second times is equal to or less than a temperature threshold, and sets a second estimation coefficient as the estimation coefficient when one of temperatures measured at the battery charging or discharging end time, the first time, and the second time or the average of the temperatures measured at the first and second times is greater than the temperature threshold, the second estimation coefficient being lower than the first estimation coefficient.

12. The power storage apparatus of claim 7, wherein the control circuit sets a first estimation coefficient as the estimation coefficient when a degree of deterioration at a time of start of charging is equal to or less than a first degree-of-deterioration threshold, and sets a second estimation coefficient as the estimation coefficient when the degree of deterioration at the time of start of charging is greater than the first degree-of-deterioration threshold, the second estimation coefficient being higher than the first estimation coefficient.

13. The power storage apparatus of claim 7, wherein the control circuit sets a first estimation coefficient as the estimation coefficient when a degree of deterioration at a time of end of charging or discharging is equal to or less than a second degree-of-deterioration threshold, and sets a second estimation coefficient as the estimation coefficient when the degree of deterioration at the time of end of charging or discharging is greater than the second degree-of-deterioration threshold, the second estimation coefficient being higher than the first estimation coefficient.

* * * * *